United States Patent
Song et al.

(10) Patent No.: US 9,715,851 B1
(45) Date of Patent: Jul. 25, 2017

(54) DISPLAY PANEL, METHOD OF MANUFACTURING THE SAME, DISPLAY DEVICE AND METHOD OF CONTROLLING THE DISPLAY DEVICE

(71) Applicant: BOE Technology Group Co., Ltd., Beijing (CN)

(72) Inventors: Song Song, Beijing (CN); Kazuyoshi Nagayama, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/324,767

(22) PCT Filed: Dec. 22, 2015

(86) PCT No.: PCT/CN2015/098233
§ 371 (c)(1),
(2) Date: Jan. 9, 2017

(87) PCT Pub. No.: WO2017/024717
PCT Pub. Date: Feb. 16, 2017

(30) Foreign Application Priority Data

Aug. 13, 2015 (CN) .......................... 2015 1 0498377

(51) Int. Cl.
*G09G 3/32* (2016.01)
*G09G 3/3225* (2016.01)
*H01L 27/32* (2006.01)

(52) U.S. Cl.
CPC ....... *G09G 3/3225* (2013.01); *H01L 27/3227* (2013.01); *H01L 27/3276* (2013.01); *G09G 2320/029* (2013.01); *G09G 2320/0233* (2013.01); *G09G 2320/0693* (2013.01); *G09G 2360/148* (2013.01); *G09G 2380/02* (2013.01)

(58) Field of Classification Search
CPC combination set(s) only.
See application file for complete search history.

(56) References Cited

U.S. PATENT DOCUMENTS 8,569,758 B2  10/2013  Sun et al.
8,940,560 B2   1/2015  Sun et al.
(Continued)

FOREIGN PATENT DOCUMENTS

CN   101604085 A   12/2009
CN   101762922 A    6/2010
(Continued)

OTHER PUBLICATIONS

International Search Report and Written Opinion of International Application No. PCT/CN2015/098233, dated May 20, 2016, 9 pages.
(Continued)

*Primary Examiner* — Van Chow
(74) *Attorney, Agent, or Firm* — Westman, Champlin & Koehler, P.A.

(57) ABSTRACT

The present disclosure discloses a display panel, a method of manufacturing the display panel, a flexible display device and a method of controlling the flexible display device. The display panel according to the present disclosure includes display units and sensing units configured to detect brightness of the display units, and the display units and the sensing units are simultaneously formed on different regions of a same base substrate.

17 Claims, 7 Drawing Sheets

(56) References Cited

U.S. PATENT DOCUMENTS

| | | | |
|---|---|---|---|
| 9,293,111 B2 | 3/2016 | Kwack et al. | |
| 2010/0315580 A1 | 12/2010 | Cho et al. | |
| 2013/0314387 A1* | 11/2013 | Kwack | G09G 5/005 |
| | | | 345/207 |
| 2015/0022090 A1* | 1/2015 | Kim | H01L 27/3225 |
| | | | 315/130 |
| 2016/0233283 A1* | 8/2016 | Kim | H01L 27/3269 |

FOREIGN PATENT DOCUMENTS

| | | |
|---|---|---|
| CN | 103426384 A | 12/2013 |
| CN | 105070738 A | 11/2015 |

OTHER PUBLICATIONS

English translation of Box No. V of the Written Opinion for the International Searching Authority for International Application No. PCT/CN2015/098233, 2 pages.

* cited by examiner

DISPLAY PANEL, METHOD OF MANUFACTURING THE SAME, DISPLAY DEVICE AND METHOD OF CONTROLLING THE DISPLAY DEVICE

CROSS-REFERENCE TO RELATED APPLICATION

This application is a National Stage Application of an International Patent Application PCT/CN2015/098233, filed Dec. 22, 2015, entitled "DISPLAY PANEL, METHOD OF MANUFACTURING THE SAME, DISPLAY DEVICE AND METHOD OF CONTROLLING THE DISPLAY DEVICE", which claims the benefit of Chinese Patent Application No. 201510498377.9 filed on Aug. 13, 2015 in the State Intellectual Property Office of China, the whole disclosure of which is incorporated herein by reference.

TECHNICAL FIELD

The present disclosure relates to the technical field of display, and particularly, to a display panel, a method of manufacturing the display panel, a display device and a method of controlling the display device.

BACKGROUND

An organic light emitting diode (OLED) display screen is regarded as an emerging technique of a next generation flat panel display because of its excellent characteristics, such as self-illumination, a high contrast, a thin thickness, a broader view angle, a high response speed, flexibility, a wide range of service temperature, a simple structure, a simple manufacturing process and the like. However, as usage time of the OLED display screen lapses, uneven brightness occurs in the OLED display screen due to attenuation of brightness of light-emitting of OLED material, unstable processes and the like.

Figure 1:
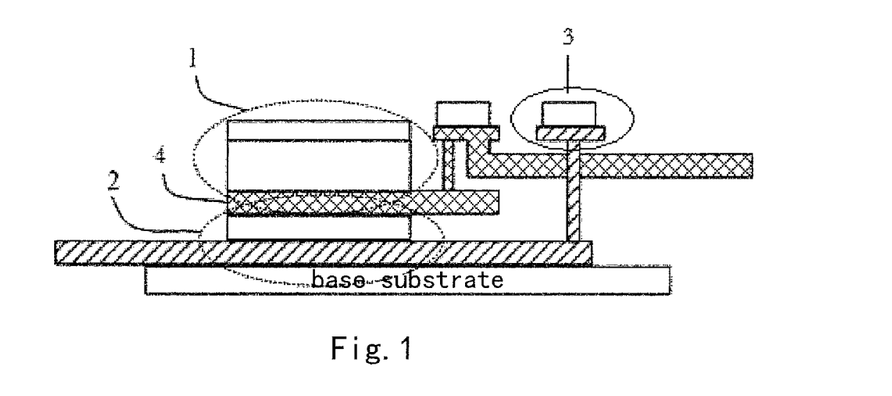
FIG. 1 is a schematic view, in cross-section, of a structure of an OLED display screen having a brightness compensation function in the prior art.

At present, a conventional OLED display panel having a function of compensating for brightness is shown in FIG. 1. A sensing device 2 is provided under a light-emitting device 1. A lower electrode 4 of the light-emitting device 1 has a hole or is made of fully transparent material, so that light emitted from the light-emitting material can be detected by the sensing device 2 provided under the light-emitting device 1. The sensing device 2 outputs detected light-sensitive property through a thin film transistor 3. With such structure, the number of layers in the structure increases due to addition of the sensing device 2, and thus more masking processes are needed during manufacture. Furthermore, since the lower electrode 4 of the light-emitting device 1 must be provided with the hole or be made of transparent material, total reflection cannot be realized and thus light emergence efficiency is reduced.

SUMMARY

Embodiments of the present disclosure provide a display panel, a method of manufacturing the display panel, a display device and a method of controlling the display device, so as to at least partially solve the above technical problem or other technical problems not mentioned herein.

There is provided a display panel, including display units and sensing units configured to detect brightness of the display units, wherein the display units and the sensing units are simultaneously formed within different regions of a same base substrate.

In an embodiment, the base substrate is a flexible substrate and is divided into a display region and a sensing region adjacent to the display region by a folding line, and the display units are disposed within the display region, and the sensing units are disposed within the sensing region, and the sensing units and the display units are symmetrical to each other with respect to the folding line.

Optionally, the display unit includes an organic light-emitting diode and a first thin film transistor, and the sensing unit includes a light-sensing diode.

Optionally, the organic light-emitting diode is provided above the first thin film transistor; an first electrode of the light-sensing diode and a source-drain metal layer of the first thin film transistor are provided in a same layer, or an first electrode of the light-sensing diode and a gate metal layer of the first thin film transistor are provided in a same layer, and a light-sensitive layer of the light-sensing diode and an active layer of the first thin film transistor are provided in a same layer, and a second electrode of the light-sensing diode and an upper electrode of the organic light-emitting diode facing away the base substrate are provided in a same layer.

Optionally, the sensing unit further comprises a second thin film transistor configured to control output signals of the light-sensing diode, and the second thin film transistor and the first thin film transistor are formed simultaneously.

In an embodiment, a lower electrode of the organic light-emitting diode close to the base substrate is made of light-reflective material.

Optionally, the sensing unit and the display unit are controlled by a same gate line.

Optionally, the sensing region is disposed at a side of the display region and is identical with the display region in size, or the sensing region is disposed at two sides of the display region.

Optionally, the display region includes a plurality of display sub-regions, the sensing region is provided therein with a plurality of sensing sub-regions corresponding to the plurality of display sub-regions in one-to-one correspondence, and each sensing sub-region is provided therein with at least one sensing units.

There is also provided a method of manufacturing a display panel, including:
  providing a base substrate; and
  simultaneously forming display units in a display region of the base substrate and sensing units in a sensing region, adjacent to the display region, of the base substrate.

Optionally, the display unit includes an organic light-emitting diode and a first thin film transistor, and the sensing unit includes a light-sensing diode;
  the step of simultaneously forming display units in a display region of the base substrate and sensing units in a sensing region, adjacent to the display region, of the base substrate includes a process of forming the first thin film transistor and a process of forming the light-emitting diode, wherein a first electrode of the light-sensing diode is simultaneously formed in the sensing region while a source-drain metal layer or a gate metal layer of the first thin film transistor is formed in the display region; a light-sensitive layer of the light-sensing diode is simultaneously formed in the sensing region while an active layer of the first thin film transistor is formed in the display region; and a second electrode of the light-sensing diode is simultaneously formed in the sensing region while an upper electrode, facing away the base substrate, of the organic light-emitting diode is formed in the display region.

Optionally, the sensing unit further includes a second thin film transistor, and the second thin film transistor is simultaneously formed while the respective processes for forming the first thin film transistor are performed.

There is provided a display device, including any display panel mentioned above.

The display device further includes a top cover covering the display region of the display panel to provide protection, wherein the sensing units are attached to a surface of the top cover close to the display panel.

In an embodiment, the display panel is a flexible display panel, and a back face of the sensing region is attached to the surface of the top cover close to the display panel, and when the top cover is closed, the sensing region is folded along the folding line to be provided above the display region.

Further, the display device further includes a brightness compensating switch configured to start a brightness detecting and compensating function.

There is provided a method of controlling any display device mentioned above, including:

triggering the brightness compensating switch to start the brightness detecting and compensating function;

displaying test pictures by the display panel;

collecting brightness signals by the sensing units and outputting the collected brightness signals.

amplifying the brightness signals and converting the brightness signals into digital signals.

on the basis of corresponding the digital signals to the respective display sub-regions of the display region, calculating average values of the corresponding digital signals for the respective display sub-regions; and compensating the respective display sub-regions based on the calculated results.

Optionally, the test pictures includes full-white or full-black pictures of respective primary colors.

Optionally, the brightness compensating switch is triggered by closing the top cover.

BRIEF DESCRIPTION OF THE DRAWINGS

In order to explain technical solutions of embodiments of the present application more clearly, the drawings that are used to illustrate the embodiments will be described briefly below. Apparently, the drawings described below only show some of the embodiments of the present application. One skilled in the art can obtain other drawings according to these drawings without paying any inventive efforts.

DETAILED DESCRIPTION OF THE EMBODIMENTS

Technical solutions according to the embodiments of the present application will be explicitly and completely described hereinafter with reference to attached drawings. Obviously, the described embodiments are only some, rather than all, of the embodiments of the present application.

The embodiment of the present disclosure provides a display panel including display units and sensing units configured to detect brightness of the display units. The display units and the sensing units are simultaneously formed on different regions of a same base substrate.

The display panel according to an embodiment of the present disclosure includes a plurality of display units and a plurality of sensing units simultaneously formed on different regions of a same base substrate. The sensing units are configured to detect brightness of some of the display units so as to provide a function of detecting and compensating for the brightness. Generally, the display unit mainly includes a display device, a thin film transistor configured for controlling an operation of the display device and signal lines, and a main component of the sensing unit is a light-sensing device. Electrodes of the light-sensing device and signal lines connected with the electrodes may be formed simultaneously while a metal layer of the thin film transistor is formed. Generally, a layer of light-sensing material of the light-sensing device is made of semiconductor material having light-sensitive property, such as organic photoconductor, Si, cadmium sulfide, zinc oxide and the like. The sensing unit and the display unit may be simultaneously formed in a same process by selecting for an active layer of the thin film transistor of the display unit the same material as used for the layer of light-sensing material. Accordingly, in the display panel according to the embodiment of the present disclosure, no additional manufacturing process is needed for addition of the sensing unit. Furthermore, the sensing units formed simultaneously while forming the display units may be attached to a top cover for the display region by folding the sensing units (or cutting the sensing units and then mounting it). After the top cover is closed, the sensing units cover the display region. Then, test pictures are displayed to obtain brightness data, and a compensation value is calculated and stored. After the top cover is opened, compensation is performed based on the calculated compensation value, so as to solve the problem that the brightness is uneven. It should be noted that calculation of the compensation value based on the brightness data and compensation may be performed by any suitable way well known for one skilled in the art. The embodiment of the present disclosure does not limit the suitable way.

In one example, the layer of light-sensitive material of the light-sensing device of the sensing unit and the active layer of the thin film transistor may be made of monocrystalline silicon, polycrystalline silicon or amorphous silicon, and are formed in a same process.

Figure 2:
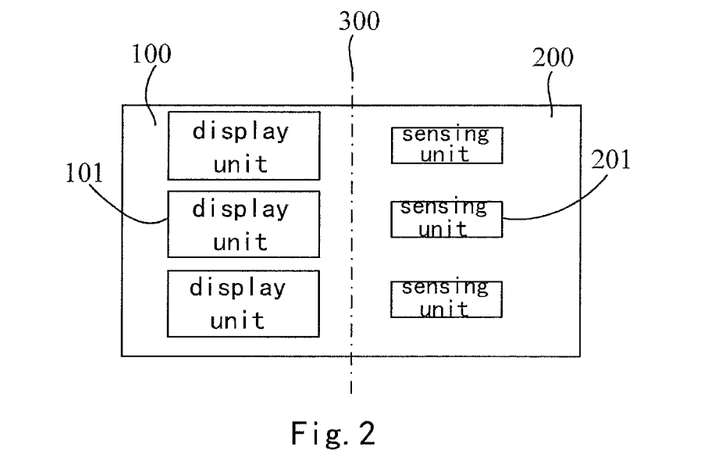
FIG. 2 is a schematic view, in plan, of a structure of a display panel according to an embodiment of the present disclosure.

As shown in FIG. 2, as an exemplary example of the embodiment, the base substrate may be a flexible substrate and is divided into a display region 100 and a sensing region 200 adjacent to the display region 100 by a folding line 300. The display units 101 are disposed within the display region 100, and the sensing units 201 are disposed within the sensing region 200. The sensing units 201 and the display units 101 are symmetrical with respect to the folding line 300. Then the sensing units 201 may cover the display units 101 by folding the sensing region along the folding line 300, so as to realize the function of detecting brightness. Further, since the base substrate may be a flexible substrate, the base substrate may be folded along the folding line 300 without cutting. Thus, the sensing units 201 may directly extend the signal lines of the display units 101 to the sensing region so as to drive without additional driving circuits. During manufacturing, the signal lines of the sensing units 201 and the signal lines of the display units 101 may be formed in a same process without additional process. The respective signal lines required for the sensing units 201 may extend to a predetermined region and be connected with an external signal-generating unit and a brightness data processing unit by a flexible printed circuit (FPC) board.

It should be noted that the base substrate may be a flexible substrate that is manufactured by any suitable flexible manufacturing process in the prior art. The embodiment of the present disclosure does not limit manufacturing processes for the base substrate. For example, a flexible substrate may be attached to a hard substrate firstly, and then manufacturing processes are performed on the flexible substrate. After completing the respective manufacturing processes, the flexible substrate will be removed from the hard substrate.

In order that one skilled in the art can better understand a structure of the display panel according to the embodiments of the present disclosure more clearly, the display panel and the method of manufacturing the display panel according to the present disclosure will be explained in detail by referring to the respective embodiments.

By taking an OLED flexible display device as an example, the base substrate of the display panel is a flexible substrate, such as a polyimide (PI) substrate, and is divided into left and right portions along the folding line 300. One portion is provided thereon with the display units 101, and the other portion is provided thereon with the sensing units 201. The display unit 101 includes an organic light-emitting diode and a first thin film transistor. The organic light-emitting diode is provided on the first thin film transistor. The term "first thin film transistor" is a collective term for thin film transistors configured for driving circuits hereinafter. The sensing unit 201 includes a light-sensing diode and a second thin film transistor configured for controlling output signals of the light-sensing diode. An first electrode of the light-sensing diode and a source-drain metal layer of the first thin film transistor are provided in a same layer (in a case that the first thin film transistor is a bottom gate type TFT, or the first electrode of the light-sensing diode and a gate metal layer of the first thin film transistor are provided in a same layer, the first electrode of the light-sensing diode and the gate metal layer are provided in a same layer; in a case that the first thin film transistor is a top gate type TFT, the first electrode of the light-sensing diode and the source-drain metal layer are provided in a same layer). A light-sensitive layer of the light-sensing diode and an active layer of the first thin film transistor are provided in a same layer, and a second electrode of the light-sensing diode and an upper electrode of the organic light-emitting diode facing away the base substrate are provided in a same layer. The first electrode of the light-sensing diode is an upper electrode thereof, and the second electrode of the light-sensing diode is a lower electrode thereof. The second and first thin film transistors are formed simultaneously, without requiring any manufacturing process to be added due to introduction of the sensing units. At a later stage, the sensing region is folded to be attached to the top cover of the display region. When the top cover is closed, the sensing units cover the display region. Then, test pictures are displayed to obtain brightness data, and a compensation value is calculated and stored. After the top cover is opened, compensation is performed based on the calculated compensation value, so as to solve the problem that the brightness is uneven.

Figure 3:
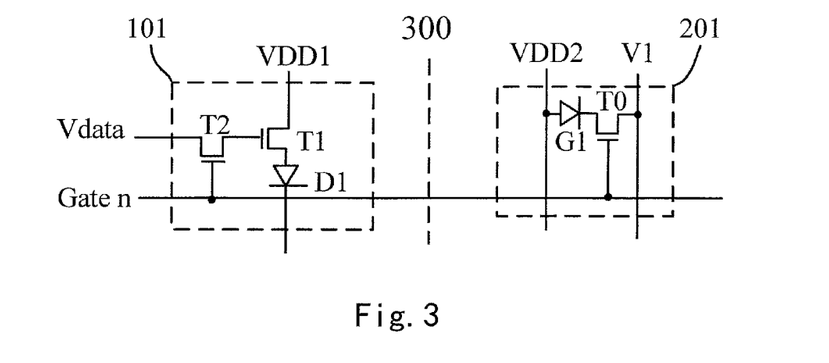
FIG. 3 is a first schematic view of a circuit of a display unit and a sensing unit according to an embodiment of the present disclosure.

Specifically, as shown in FIG. 3, the display unit 101 includes a driving transistor T1, a switch transistor T2 and an organic light-emitting diode D1. A gate line (e.g., Gate n) is connected to a gate of the switch transistor T2, and a data line Vdata is connected to a source of the switch transistor T2. A drain of the switch transistor T2 is connected with a gate of the driving transistor T1. A source of the driving transistor T1 is applied with a first work voltage VDD1. A drain of the driving transistor T1 is connected with the organic light-emitting diode D1. The sensing unit 201 includes a light-sensing diode G1 and a second switch transistor T0 configured for controlling output signals of the light-sensing diode G1. One terminal of the light-sensing diode G1 is applied with a second work voltage VDD2, and the other terminal of the light-sensing diode is connected to a source of the second switch transistor T0. A drain of the second switch transistor T0 is connected with a sensing signal output line V1. A gate of the second switch transistor T0 and the display unit 101 are connected to a same gate line (e.g., Gate n), that is, the display unit 101 and the corresponding sensing unit 201 for testing the brightness of the display unit 101 are controlled by the same gate line, and when the organic light-emitting diode D1 of the display unit 101 emits the light, the second switch transistor T0 is switched on and the sensing unit 201 collects and outputs brightness signals.

Figure 4A:
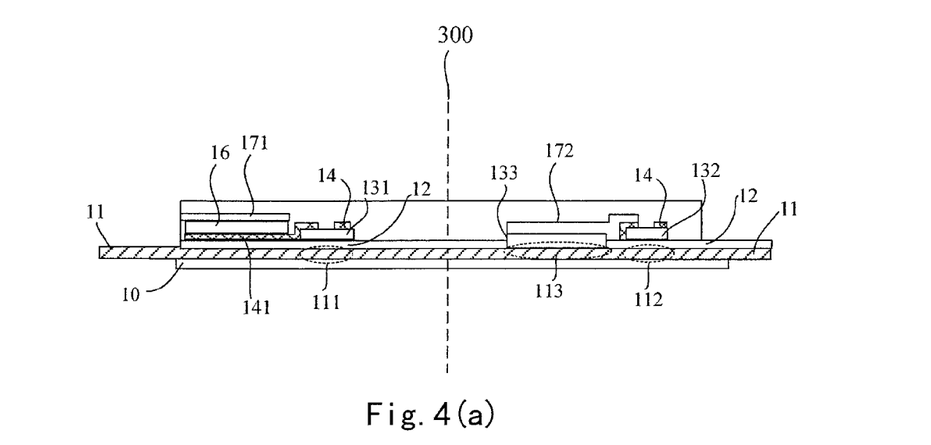
FIG. 4(a) is a first schematic view, in cross-section, of the structure of the display panel according to an embodiment of the present disclosure.

The driving transistor T1 and the switch transistor T2 (the first thin film transistor mentioned above is a collective term for the driving transistor T1 and the switch transistor T2) and the second switch transistor T0 (i.e., the second thin film transistor mentioned above) have a same structure and are formed simultaneously. Accordingly, in a cross-section view of a structure of the display panel as shown in FIG. 4(a), only one first thin film transistor (the switch transistor T2 is shown in the figure) and the organic light-emitting diode D1 are schematically shown in the display region, and the second switch transistor T0 and the light-sensing diode G1 are shown in the sensing region. The base substrate 10 is provided thereon with the gate metal layer 11, a gate insulating layer 12, the active layer, the source-drain metal layer 14, a layer 16 of organic light-emitting material and a transparent conductive layer from top to bottom. The gate metal layer 11 forms the gate 111 of the first thin film transistor and gate lines in the display region, the gate 112 of the second switch transistor T0 and the lower electrode (the first electrode 113) of the light-sensing diode G1 in the sensing region, and gate lines extending to the sensing region. The gate insulating layer 12 forms gate insulating layers of the first thin film transistor and of the second switch transistor T0 and insulating film layers retained on other portions where insulation is needed. The active layer forms the active layer 131 of the first thin film transistor, the active layer 132 of the second switch transistor T0 and the layer 133 of light-sensitive material of the light-sensing diode G1. The source-drain metal layer 14 forms the source and drain of the first thin film transistor, data lines, the lower electrode 141 of the organic light-emitting diode D1 and the first work voltage signal line VDD1 in the display region, and also forms the source and drain of the second switch transistor T0, a sensing signal output line V1 and the second work voltage signal line VDD2 in the sensing region. The source-drain metal layer 14 may be made of metal material having reflective property, so as to improve light-emergence efficiency. The layer 16 of organic light-emitting material forms a light-emitting layer of the organic light-emitting diode D1. The transparent conductive layer forms the upper electrode 171 of the organic light-emitting diode D1 and the second electrode 172 (the upper electrode) of the light-sensing diode G1.

Figure 4B:
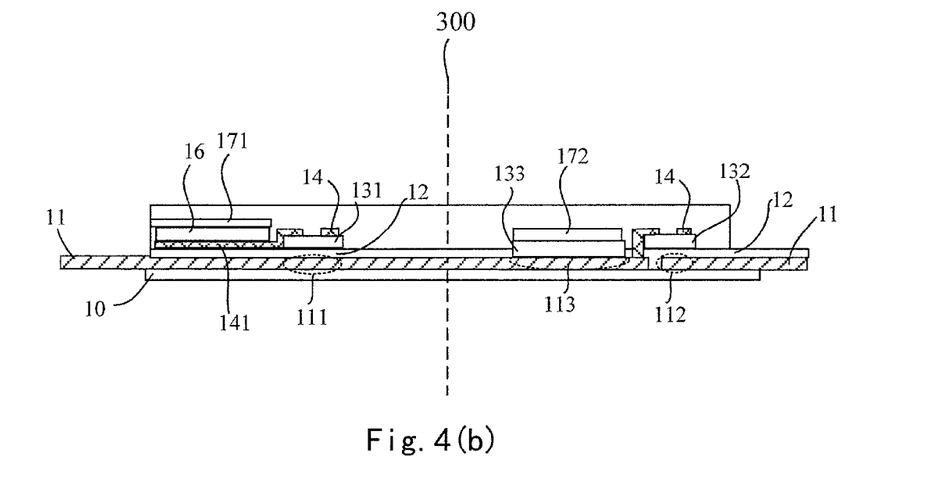
FIG. 4(b) is a second schematic view, in cross-section, of the structure of the display panel according to an embodiment of the present disclosure.

FIG. 4(b) shows a structure, in cross-section, of another exemplary display panel according to the embodiment of the present disclosure. The structure shown in FIG. 4(b) is different from the structure shown in FIG. 4(a) in that the drain of the second switch transistor T0 is connected to the first electrode 113 (the lower electrode) of the light-sensing diode G1 through a via-hole.

It should be noted that FIGS. 4(a) and 4(b) simply show, in cross-section, position relations of respective film layers of the display panel and do not relate to details, such as a pattern of some film layer. In other words, what is shown in the figures is not intended to define specific patterns of the respective film layers, and one skilled in the art can design the patterns according to actual requirements.

Figure 5:
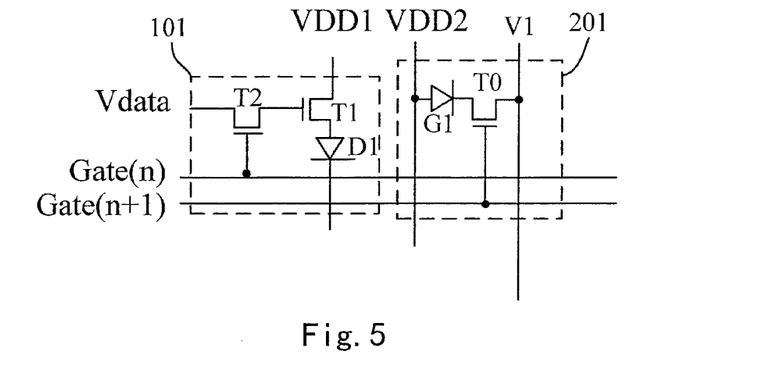
FIG. 5 is a second schematic view of the circuit of the display unit and the sensing unit according to an embodiment of the present disclosure.
Figure 6:
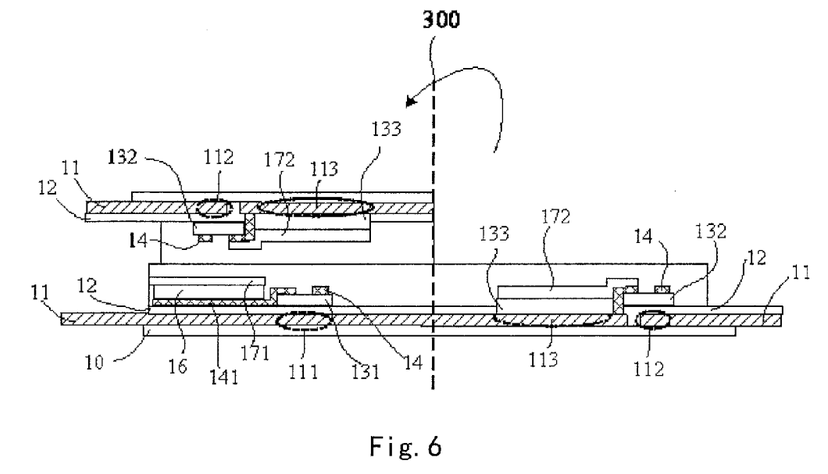
FIG. 6 is a schematic view of the display panel according to an embodiment of the present disclosure, in which the display panel is folded.

Further, it should be noted that the display unit 101 mentioned above only includes the organic light-emitting diode D1, the driving transistor T1 and the switch transistor T2. However, the present disclosure is not limited to this. The display unit 101 typically may further include compensation circuits configured to eliminate threshold voltage drift, inconsistency and the like. It should be noted that since the compensation circuits are typically formed by thin film transistors, they may be formed simultaneously while the driving transistor T1 and the switch transistor T2 are formed. The details of forming the compensation circuits is therefore omitted in the present disclosure. Further, in the embodiment of the present disclosure, the sensing unit 201 and the display unit 101 are controlled by a same gate line, and thus a mask used for manufacturing the gate metal layer is hardly needed to be modified, and devices and signal lines of the circuit are more easily arranged when designed. In practice, however, the sensing unit 201 may be controlled by a gate line next to the gate line for controlling the display unit 101, as shown in FIG. 5. That is, the display unit 101 is controlled by the nth gate line (n is a natural number), and the sensing unit 201 is controlled by the n+1th gate line. In this way, when the nth gate line is switched on, the display unit 101 in the nth row is loaded with display signals. Then, the nth gate line is switched off and the n+1th gate line is switched on, and the display unit 101 in the n+1th row is loaded with display signals. Meanwhile the display unit 101 in the nth row is retained to be brightened, and the sensing unit provided above the display unit 101 in the nth row and controlled by the n+1th gate line collects brightness signals. Such collected signals are more stable and measurement result is more accurate because an unstable stage during loading of display signals is skipped. Similarly, the sensing unit 201 corresponding to the display unit 101 in the nth row may be controlled by other following adjacent gate lines, such as the n+2th gate line, the n+3th gate line and the like.

Further, in a case where the driving transistor T1 and the switch transistor T2 are in a top-gate structure, the second electrode of the light-sensing diode G1 may also be provided in the same layer as that in which the source-drain metal layer of the thin film transistor lies, and the light-sensitive layer of the light-sensing diode G1 is still provided in the same layer as that in which the active layer of the thin film transistor lies. The upper electrode is required to be made of transparent conductive material and is not limited to be provided in the same layer as that in which the upper electrode of the organic light-emitting diode D1 lies.

After the manufacturing processes for the display panel mentioned above have been completed, a protection film is attached to the display panel. And when other essential processes have been completed, each display panel is folded along the folding line 300, and a back face (which forms an upper surface of the folded display panel) of the sensing region is attached to a surface of the top cover close to the display panel. When the top cover is opened, the sensing region of the display panel is unfolded and lies in a same plane as that where the display region lies. When the top cover is closed, the sensing region is folded along the folding line 300 to be provided above the display region. The sensing units 201 in the sensing region cover the corresponding display units 101. In this case, a light-receiving side of the diode G1 covers a light-emitting side of the organic light-emitting diode D1 to collect brightness of the light emitted from the organic light-emitting diode D1.

In a specific illustrative embodiment, the sensing region 200 mentioned above is disposed at a side of the display region 100 and is identical with the display region 100 in size. For example, as shown in FIG. 2, the sensing region 200 is disposed at the right side of the display region 100, and a plurality of sensing units are provided at equal intervals in the sensing region 200.

Figure 7:
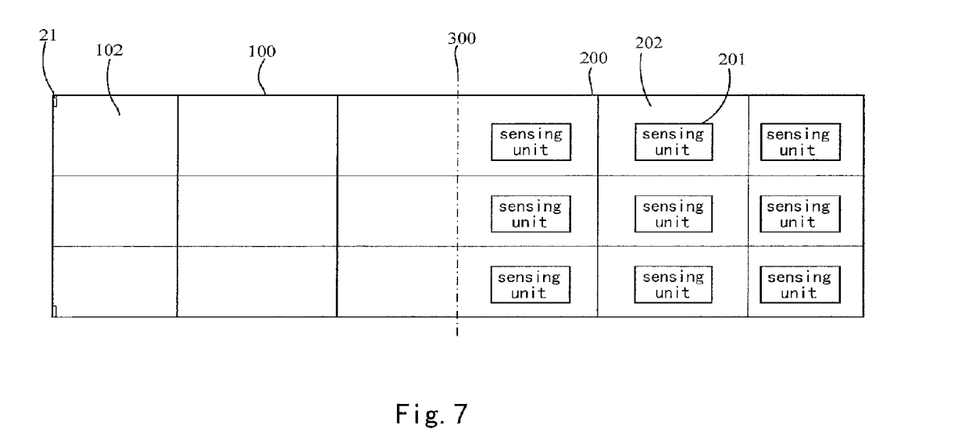
FIG. 7 is a schematic view, in plan, of a structure of another display panel according to another embodiment of the present disclosure.

FIG. 7 shows an alternative embodiment in which the sensing region 200 is disposed at the right side of the display region 100. The display region 100 includes a plurality of display sub-regions 102, and the sensing region 200 includes a plurality of sensing sub-regions 202 corresponding to the plurality of display sub-regions 102 in one-to-one correspondence. Each sensing sub-region 202 is provided therein with at least one sensing units 201. For example, as shown in FIG. 7, the display region is divided into nine display sub-regions 102, and the sensing region 200 is also divided into nine sensing sub-regions 202. In each sensing sub-region 202, one sensing unit 201 is provided to sense the brightness of the corresponding display sub-region. The sensed brightness signals are then amplified, and are subject to sequent processing, such as analog-digital conversion. Finally, an average value of the brightness signals is calculated to determine compensation current values required for each sub-region. When the top cover is opened again, compensation can be performed based on the determined compensation current values. The sensing region 202 is not limited to be divided into nine sensing sub-regions 202 and can be divided into many sensing sub-regions. The number of the sensing units 201 in each sensing sub-region 202 is not limited to one and may be plural. It should be noted that as the number of the display sub-regions increases and the number of the sensing units 201 increases, complexity of calculation program or procedure will be increased accordingly.

Figures 8, 9:
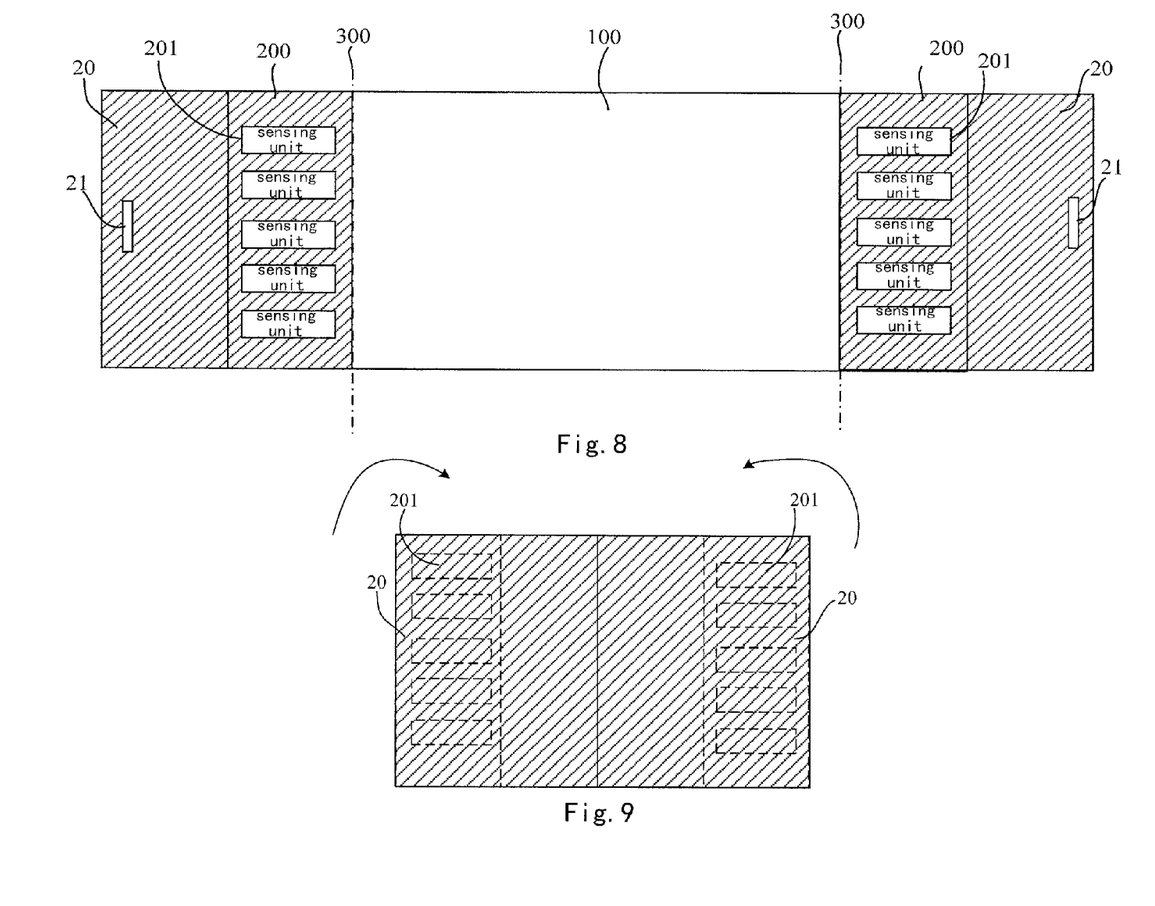
FIG. 8 is a schematic view, in plan, of a structure of a further display panel according to a further embodiment of the present disclosure.
FIG. 9 is a schematic view of the display panel shown in FIG. 8, in which the top cover is closed.
Figure 10:
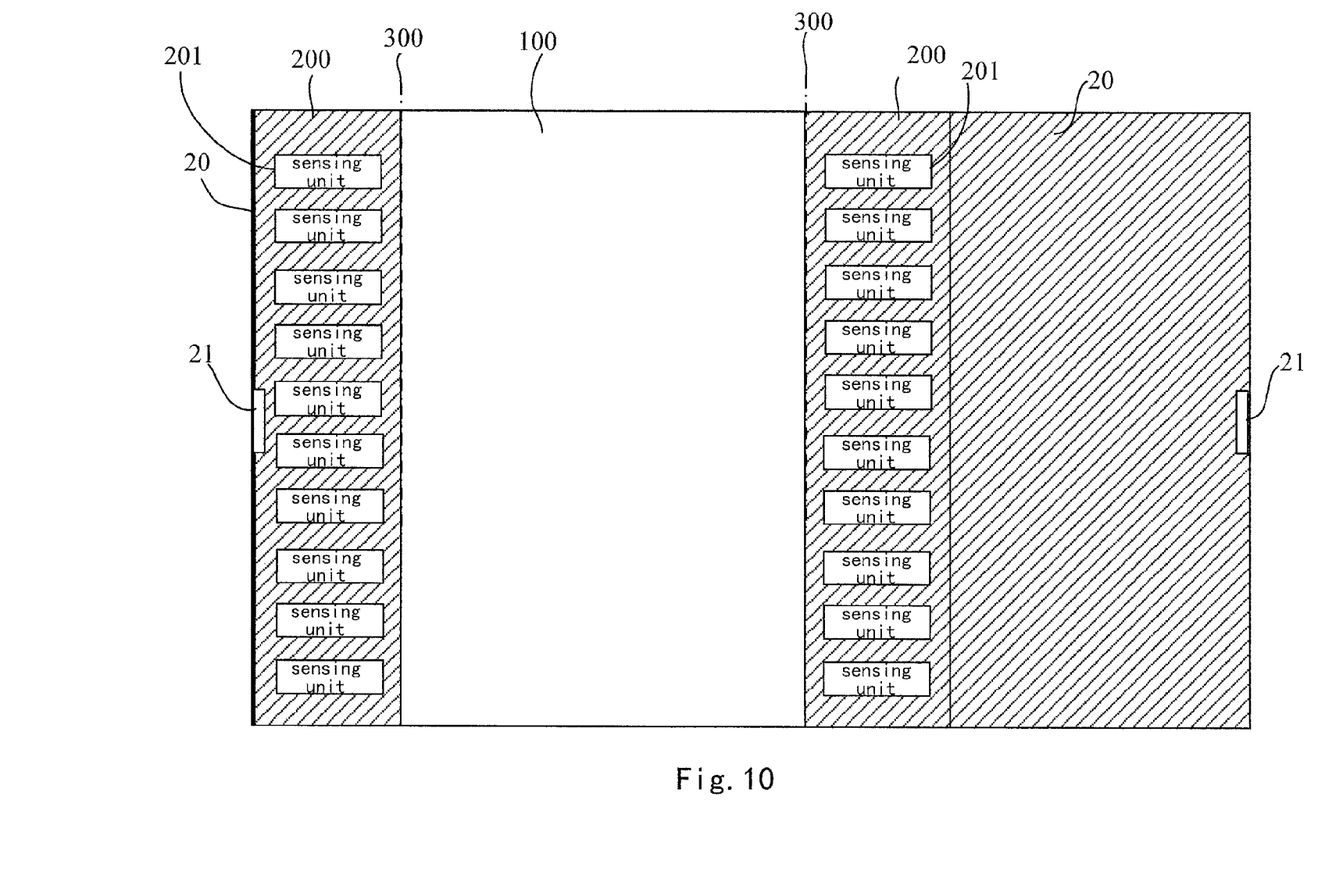
FIG. 10 is a schematic view, in plan, of a structure of a yet further display panel according to a yet further embodiment of the present disclosure.
Figure 11:
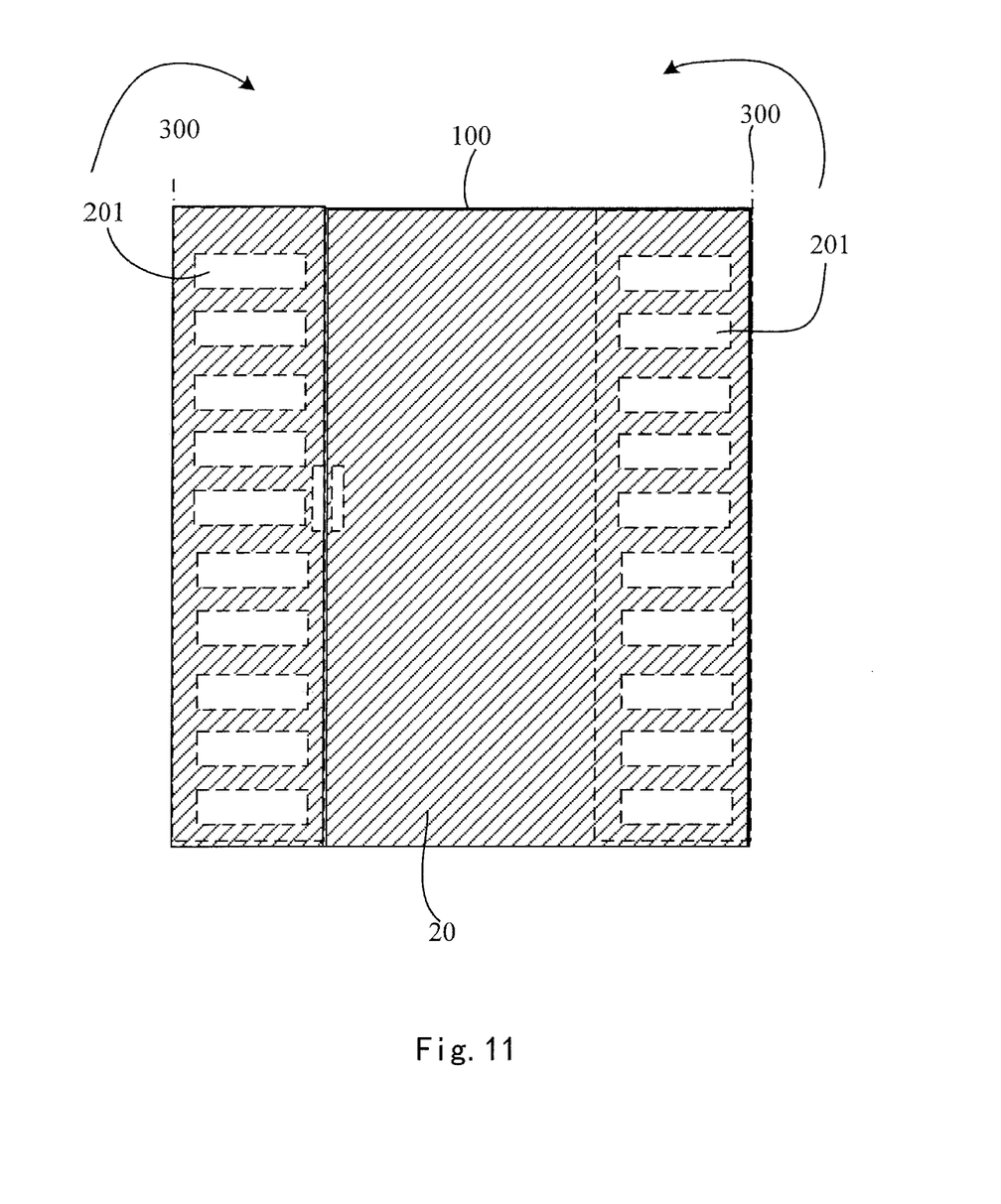
FIG. 11 is a schematic view of the display panel shown in FIG. 10, in which the top cover is closed.

FIGS. 8 and 9 show another alternative embodiment which is different from the embodiment shown in FIG. 7 in that the sensing regions 200 are disposed at two short-side sides of the display region 100, respectively. When the top cover is closed, the sensing regions 200 only cover parts of the display region 100 at the left and right sides thereof. FIGS. 10 and 11 show a similar embodiment which is different from the embodiment shown in FIGS. 8 and 9 in that the sensing regions 200 are disposed at two long-side sides of the display region 100, respectively, that is, the sensing units 201 are arranged along the length direction of the display region 100, and the top cover at the left side of the figure is identical with the sensing region at the left side in size, and the top cover at the right side of the figure is greater than the sensing region at the right side in size. Since no much PI substrate is wasted for producing a sensing structure, these two embodiments can save cost. Furthermore, since the sensing units are arranged in a direction extending either along the maximum side length or along the minimum side length of the display region, variation trend in brightness of a screen along a longitudinal direction or a lateral direction can be substantially sensed after brightness average values for the respective display sub-regions of the display region have been calculated, and compensation can be performed accordingly.

In the display panel according to the embodiments of the present disclosure, brightness-sensing devices can be formed without requiring any additional manufacturing process. At a later stage, the brightness-sensing devices are folded (or are mounted after being cut off) to be attached to an inner side of the top cover of the panel. When the top cover is closed, the sensing devices cover the display region. Then, test pictures are displayed to obtain brightness data, and compensation values are calculated and stored. After the top cover is opened, compensation is performed based on the calculated compensation values, so as to solve the problem that the brightness is uneven. Since the sensing devices receive the light emitted from a side of the display panel, the lower electrode of the light-emitting device close to the base substrate may be made of reflective material so as to improve light-emergence efficiency.

The embodiments of the present disclosure also provide a display device including any display panel as mentioned above. Since no additional process is needed for addition of the brightness-sensing devices in the display device, extra value of a product can be added without nearly increasing the cost, such that the display device has a brightness adjusting and compensating function and provides a more even display brightness, thereby obtaining good display effects. The display device may be any product or device that can have a display function, such as a liquid crystal panel, electronic paper, an OLED panel, a cellphone, a panel computer, a TV, a displayer, a notebook PC, a digital photo frame, a navigator and the like.

Further, the display device according to the embodiments of the present disclosure is also provided with a brightness compensating switch configured for enabling a brightness detecting and compensating function. As shown in FIGS. 8-11, the brightness compensating switch 21 may be provided at a corner of an edge of the top cover (or the panel) or at other positions thereof. The brightness compensating switch 21 may be a physical switch or a virtual switch. In a case that the brightness compensating switch 21 is a virtual switch, it is only displayed on the panel and no physical room on the panel is occupied.

Further, in an embodiment, the brightness compensating switch may be provided to be associated with the top cover. When the top cover is closed, the brightness compensating switch is switched on, and a related program runs in background to realize the brightness detecting and compensating function.

In an alternative embodiment, the brightness compensating switch may be provided to be associated with a shutdown button (be physical or virtual). When a shutdown instruction is received from a user, the user may habitually close the top cover, such that the brightness compensating switch is triggered to be switched on. Then, the display units display compensated pictures, and the sensing units collect the brightness signals. The compensation values are then calculated and stored. When the display device is started up again, compensation is performed based on the calculated compensation values. In this way, the problem that the brightness is uneven can be solved.

The present embodiment provides a method of manufacturing a display panel. The method includes providing a base substrate, and simultaneously forming display units in a display region of the base substrate and sensing units in a sensing region, adjacent to the display region, of the same base substrate.

In the display panel manufactured by the method, the display units and the sensing units configured for detecting the brightness of the display units are formed simultaneously. The sensing units can be formed without requiring any additional manufacturing process. At a later stage, the sensing units are folded (or are mounted after being cut off) to be attached to the top cover for the display region. When the top cover is closed, the sensing units cover the display region. Then, test pictures are displayed to obtain brightness data, and a compensation value is calculated and stored. After the top cover is opened, compensation is performed based on the calculated compensation value, so as to solve the problem that the brightness is uneven.

Specifically, by taking a flexible display device as an example, the base substrate is a flexible substrate. The display region and the sensing region are delimited by a folding line and are symmetrical with respect to the folding line. It should be noted that the term "symmetrical" herein means that a sensing unit and a display unit designed to correspond to the sensing unit are symmetrical with respect to the folding line.

The display unit includes an organic light-emitting diode and a first thin film transistor, and the sensing unit includes a light-sensing diode. The manufacturing processes for the display panel mainly include a process of forming the first thin film transistor and a process of forming the light-emitting diode, wherein a first electrode of the light-sensing diode is simultaneously formed in the sensing region while a source-drain metal layer or a gate metal layer of the first thin film transistor is formed in the display region; a light-sensitive layer of the light-sensing diode is simultaneously formed in the sensing region while an active layer of the first thin film transistor is formed in the display region; and a second electrode of the light-sensing diode is simultaneously formed in the sensing region while an upper electrode, facing away the base substrate, of the organic light-emitting diode is formed in the display region. The sensing unit further includes a second thin film transistor. The second thin film transistor is simultaneously formed while the respective processes for forming the first thin film transistor are performed. Specific processes may be apparent by referring to the description about Embodiment 1. A detailed description about the specific processes is omitted herein.

After the manufacturing processes for the display panel have been completed, a protection film may be attached to the display panel. When other essential processes have been completed, each display panel is folded along the folding line 300, and a back face (which forms an upper surface of the folded display panel) of the sensing region is attached to a surface of the top cover close to the display panel. When the top cover is closed, the sensing region of the display panel is changed from an unfolded condition into a condition of being provided above the display region. At this time, pictures for brightness test are displayed, and the sensing units collect the brightness information of the corresponding display units. The compensation values are then calculated and stored based on the collected brightness information. When the top cover is opened, compensation is performed based on the calculated compensation values. In this way, the problem that the brightness is uneven can be solved.

In the method of manufacturing the display panel according to the embodiment of the present disclosure, brightness sensing devices can be formed without requiring any additional processes, and the problem of the brightness being uneven can be solved.

The embodiment of the present disclosure also provides a method of controlling a display device including any display panel mentioned in the embodiments of the present disclosure, that is, the display panel on which the display units and the sensing units are formed simultaneously and in which the sensing units are attached to the top cover of the display region by folding the sensing units (or being mounted after being cut off) at a later stage. The method of controlling the display device according to the present embodiment includes:

Step 1, triggering the brightness compensating switch to start up the brightness detecting and compensating function, wherein optionally the brightness compensating switch may be triggered by closing the top cover.

Step 2, displaying test pictures by the display panel, wherein optionally the test pictures may include full-white or full-black pictures based on respective primary colors. But, the present disclosure is not limited to this. The test pictures may be other test pictures suitable for brightness test.

Step 3, collecting brightness signals by the sensing units and outputting the collected brightness signals.

Step 4, amplifying the brightness signals and converting the brightness signals into digital signals.

Step 5, on the basis of corresponding the digital signals to the respective display sub-regions of the display region, calculating average values of the corresponding digital signals for the respective display sub-regions and;

Step 6, compensating the respective display sub-regions based on the calculated results.

Figure 12:
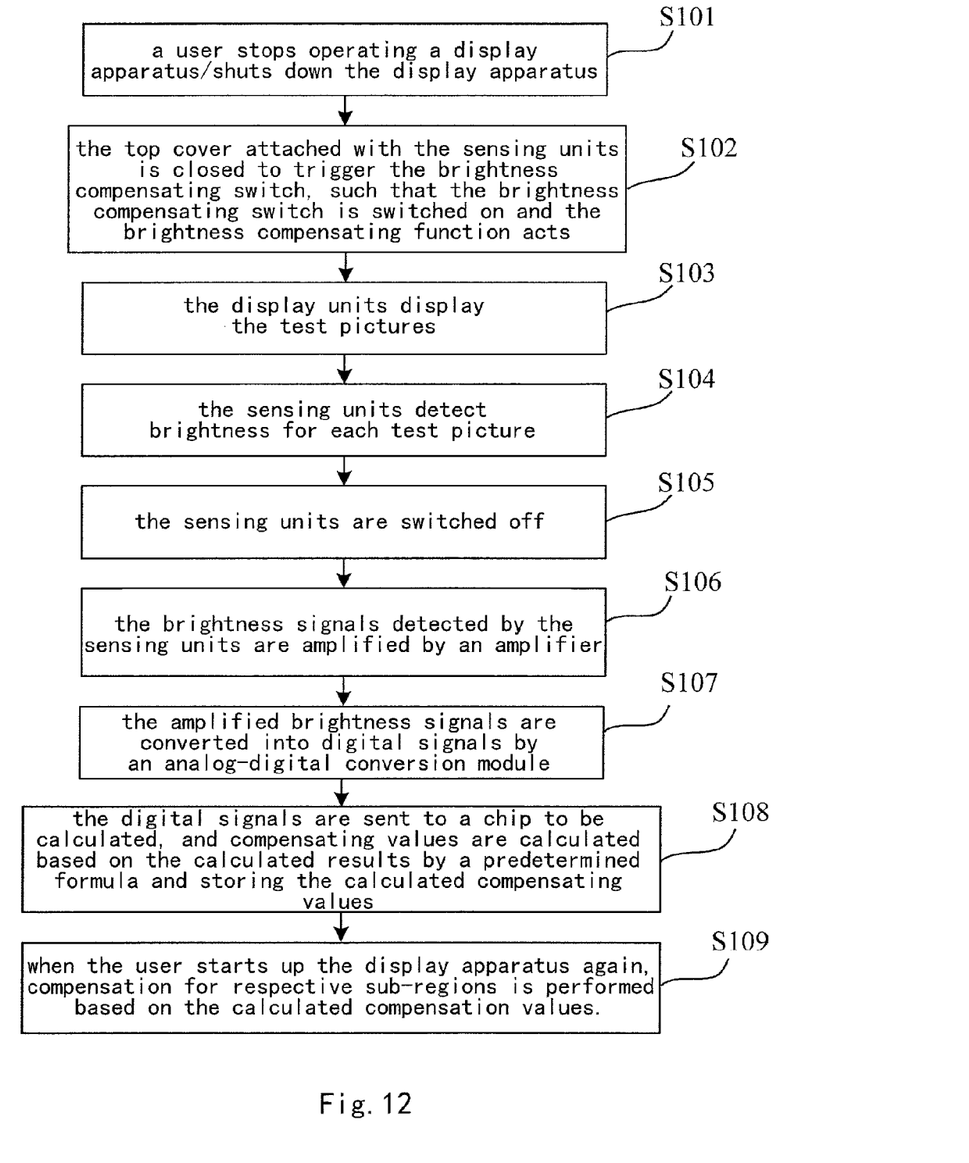
FIG. 12 is a flowchart of a method of controlling a display panel according to a yet further embodiment.

As shown in FIG. 12, a specific example is taken to explain the controlling method mentioned above. Specifically, the controlling method includes:

S101 stopping operating a display apparatus/shuts down the display apparatus by a user, S102 closing the top cover attached with the sensing units to trigger the brightness compensating switch, such that the brightness compensating switch is switched on and the brightness compensating function acts in background, S103 displaying by the display units the test pictures in sequence, wherein the test pictures typically may include full-white or full-black pictures of each primary color, or one or more grayscale pictures of each primary color, S104 with respect to the sensing units, detecting brightness for each test picture, S105 switching off the sensing units, S106 amplifying the brightness signals detected by the sensing units by an amplifier, S107 converting the amplified brightness signals into digital signals by an analog-digital conversion module, S108 sending the digital signals to a chip to be processed, wherein calculations running in the chip mainly include calculating average values for the display sub-regions of the display region, calculating compensating values based on the calculated average values by a predetermined formula and storing the calculated compensating values into a memory (for example, a flash memory), S109 performing compensation for respective sub-regions based on the calculated compensation values, when the user starts up the display apparatus again.

In an optional embodiment, a brightness detecting function may be implanted into a shutdown program, and a shutdown picture may be provided as a test picture required for brightness detection. When the user shuts down the display apparatus, the top cover attached with the sensing units is closed to trigger the brightness compensating switch, and then the brightness compensating switch is switched on to start up the brightness detecting and compensating function in background so as to calculate and store the compensation values. When the user starts up the display apparatus again, the compensated picture are displayed. The controlling method according to the present embodiment accords with use habit of the user without increasing complexity of operation and also can improve display effects.

Concerning the above, the present disclosure provides a display panel, a method of manufacturing the display panel, a display device and a method of controlling the display device. According to the present disclosure, the sensing devices may be simultaneously formed while the display devices are formed, without requiring additional processes. In particular, a flexible property of a flexible substrate is employed in the embodiments of the present disclosure. The sensing devices are simultaneously formed on the flexible substrate while the display units are formed, and are attached to the top cover that covers above the light-emitting region. When the display apparatus is shut down and the top cover is closed, the brightness data is obtained and the compensation values are calculated and stored. When the display apparatus is started up again, compensation is performed based on the compensation values without requiring any additional process and hence without increasing cost and power consumption. Also, a flexible screen can be protected while the brightness is compensated.

In the present disclosure, the expressions "first", "second" and the like are used to distinguish similar components for purpose of clarity. "First" and "second" are not intended to limit the number of the components in the present disclosure and are only illustrative. Based on the teaching of the present disclosure, any change or modification obvious for one skilled in the art shall fall within the protection scope of the present disclosure.

The respective embodiments of the present application are progressively described. Same or similar parts/structures among the embodiments may be referred with each other. Different points/contents of an embodiment from other embodiments are described in details. In particular, since product embodiments correspond to method embodiments, they are described briefly. Details of those product embodiments may refer to the relevant description of the method embodiments.

One skilled in the art can understand that all or parts of the processes of the method mentioned above may be performed by instructing related hardware using a computer program.

The computer program may be stored in a computer-readable storage medium. When being executed, the program may include the respective processes of the methods mentioned above. The storage medium may be a disk, an optical disc, a Read-Only Memory (ROM) or Random Access Memory (RAM) and so on.

The above embodiments are only examples of the present application, but the protection scope of the present application is not limited to this. It would be appreciated by those skilled in the art that various modifications or alternations of the above embodiments within the scope of the present disclosure will also fall within the scope of the present application. The scope of the present application is defined by the appended claims.

What is claimed is:

1. A display panel, comprising display units and sensing units configured to detect brightness of the display units, wherein,
the display units and the sensing units are simultaneously formed within different regions of a same base substrate;
wherein the base substrate is a flexible substrate and is divided into a display region and a sensing region adjacent to the display region by a folding line, and the display units are disposed within the display region, and the sensing units are disposed within the sensing region, and the sensing units and the display units are symmetrical to each other with respect to the folding line.

2. The display panel of claim 1, wherein, the display unit comprises an organic light-emitting diode and a first thin film transistor, and the sensing unit comprises a light-sensing diode.

3. The display panel of claim 2, wherein, the organic light-emitting diode is provided above the first thin film transistor;
a first electrode of the light-sensing diode and a source-drain metal layer of the first thin film transistor are provided in a same layer, or the first electrode of the light-sensing diode and a gate metal layer of the first thin film transistor are provided in a same layer, and a light-sensitive layer of the light-sensing diode and an active layer of the first thin film transistor are provided in a same layer, and a second electrode of the light-sensing diode and an upper electrode of the organic light-emitting diode facing away the base substrate are provided in a same layer.

4. The display panel of claim 3, wherein, the sensing unit further comprises a second thin film transistor configured to control an output signal of the light-sensing diode;
the second thin film transistor is simultaneously formed while the first thin film transistor is formed.

5. The display panel of claim 2, wherein, a lower electrode of the organic light-emitting diode close to the base substrate is made of a light-reflective material.

6. The display panel of claim 1, wherein, the sensing unit and the display unit corresponding to the sensing unit are controlled by a same gate line.

7. The display panel of claim 1, wherein, the sensing region is disposed at a side of the display region and is identical with the display region in size, or the sensing region is disposed at two sides of the display region.

8. The display panel of claim 1, wherein, the display region comprises a plurality of display sub-regions,
the sensing region is provided therein with a plurality of sensing sub-regions corresponding to the plurality of display sub-regions in one-to-one correspondence, and each sensing sub-region is provided therein with at least one sensing unit.

9. A method of manufacturing a display panel, wherein, comprising:
providing a base substrate; and
simultaneously forming display units in a display region of the base substrate and sensing units in a sensing region, adjacent to the display region, of the same base substrate;
wherein the display unit comprises an organic light-emitting diode and a first thin film transistor, and the sensing unit comprises a light-sensing diode;
the step of simultaneously forming display units in a display region of the base substrate and sensing units in a sensing region, adjacent to the display region, of the same base substrate comprises a process of forming the first thin film transistor and a process of forming the light-emitting diode,
wherein a first electrode of the light-sensing diode is simultaneously formed in the sensing region while a source-drain metal layer or a gate metal layer of the first thin film transistor is formed in the display region;
a light-sensitive layer of the light-sensing diode is simultaneously formed in the sensing region while an active layer of the first thin film transistor is formed in the display region; and
a second electrode of the light-sensing diode is simultaneously formed in the sensing region while an upper electrode, facing away the base substrate, of the organic light-emitting diode is formed in the display region.

10. The method of claim 9, the sensing unit further comprises a second thin film transistor;
the second thin film transistor is simultaneously formed while the process for forming the first thin film transistor is performed.

11. A display device, comprising the display panel according to claim 1.

12. The display device of claim 11, further comprising a top cover covering the display region of the display panel to provide protection for the display region,
wherein the sensing units are provided to a surface of the top cover close to the display panel.

13. The display device of claim 12, wherein, the display panel is a flexible display panel, and a back face of the sensing region is attached to the surface of the top cover close to the display panel, and when the top cover is closed, the sensing region is folded along the folding line to be provided above the display region.

14. The display device of claim 11, further comprising a brightness compensating switch configured to start up a brightness detecting and compensating function.

15. A method of controlling the display device according to claim 11, comprising:
triggering the brightness compensating switch to start up the brightness detecting and compensating function;
displaying test pictures by the display panel;
collecting brightness signals by the sensing units and outputting the collected brightness signals;
amplifying the brightness signals and converting the brightness signals into digital signals;
on the basis of corresponding the digital signals to the respective display sub-regions of the display region, calculating average values of the corresponding digital signals for the respective display sub-regions; and
compensating the respective display sub-regions based on the calculated results.

16. The method of claim 15, wherein, the test pictures comprises full-white or full-black pictures of respective primary colors.

17. The method of claim 15, wherein, the brightness compensating switch is triggered by closing the top cover.

* * * * *